United States Patent [19]

Shimkunas et al.

[11] Patent Number: 4,680,243
[45] Date of Patent: Jul. 14, 1987

[54] METHOD FOR PRODUCING A MASK FOR USE IN X-RAY PHOTOLITHOGRAPHY AND RESULTING STRUCTURE

[75] Inventors: Alexander R. Shimkunas, Palo Alto; Barry Block, Los Altos Hills, both of Calif.

[73] Assignee: Micronix Corporation, Los Gatos, Calif.

[21] Appl. No.: 761,993

[22] Filed: Aug. 2, 1985

[51] Int. Cl.[4] .................. G21K 5/00; G03F 9/00; B44C 1/22; C23F 1/02

[52] U.S. Cl. .................. 430/5; 156/630; 156/633; 156/634; 156/652; 156/655; 156/656; 156/657; 156/659.1; 156/667; 156/272.2; 378/35; 427/160; 427/317; 430/313; 430/317; 430/318

[58] Field of Search ............... 156/629, 630, 633, 634, 156/652, 655, 656, 657, 659.1, 662, 272.2; 430/5, 313, 317, 318, 321; 378/35; 427/160

[56] References Cited

U.S. PATENT DOCUMENTS

| | | | |
|---|---|---|---|
| 3,323,967 | 6/1967 | Webb | 156/345 |
| 3,397,278 | 8/1968 | Pomerantz | 174/52 |
| 3,417,459 | 12/1968 | Pomerantz et al. | 29/472.9 |
| 3,470,348 | 9/1969 | Pomerantz et al. | 219/117 |
| 3,589,965 | 6/1971 | Wallis et al. | 156/272 |
| 3,595,719 | 7/1971 | Pomerantz | 156/17 |
| 3,674,580 | 7/1972 | Erdman | 156/13 |
| 3,738,881 | 6/1973 | Erdman et al. | 156/17 |
| 3,904,782 | 9/1975 | Pomerantz | 427/12 |
| 3,916,075 | 10/1975 | Dimigen et al. | 428/472 |
| 4,121,334 | 10/1978 | Wallis | 29/610 SG |
| 4,198,263 | 4/1980 | Matsuda | 156/657 X |
| 4,384,919 | 5/1983 | Casey | 156/645 |
| 4,515,876 | 5/1985 | Yoshihara et al. | 204/192 EC |
| 4,548,883 | 10/1985 | Wagner | 156/643 X |
| 4,608,268 | 8/1986 | Shimkunas | 427/8 |

FOREIGN PATENT DOCUMENTS

59-89422  5/1984  Japan .................. 156/643

OTHER PUBLICATIONS

E. E. Castellani et al., "Fabrication of E-Beam Projection and X-Ray Masks on a Support Frame", IBM Tech. Disclosure Bulletin, vol. 20, No. 7, Dec. 1977, pp. 2868–2871.

Wallis et al., "Field Assisted Glass-Metal Sealing", Journal of Applied Physics, vol. 40, No. 10, pp. 3946–3949, Sep. 1969.

Wallis et al, "A New Glass Sealing Process", Welding Journal, Nov. 1970.

Younger, "Hermetic Glass Sealing by Electrostatic Bonding", Journal of Non-Crystalline Solids, 38 & 39 (1980), pp. 909–914.

Buckley et al., "X-Ray Lithography Mask Technology", Solid State Science and Technology, May 1981, pp. 1116–1120.

Shimkunas, A. R., "Advances in X-Ray Mask Technology", Solid State Technology, Sep. 1984, pp. 192–199.

Erdman, "A Zirconium Mask for the Anistropic Etching of Silicon", Proceedings of the Meeting of the Electrochemical Society, Los Angeles, 1970, pp. 321 to 322.

Erdman, "A Zirconium Mask for the Anisotropic Etching of Silicon", Journal of the Electrochemical Society, vol. 117, No. 3, p. 99C, Abstract 124, 1970.

Advertisement entitled "Glass to Metal Sealing—A Proprietary Mallory Process".

Primary Examiner—William A. Powell
Attorney, Agent, or Firm—Kenneth E. Leeds; Alan H. MacPherson; Steven F. Caserza

[57] ABSTRACT

A method for manufacturing a mask (100) for use in x-ray photolithographic processes includes the step of coating a silicon wafer (10) with a layer of boron nitride (12). A masking substance (14) is used to coat one side of the boron nitride coated wafer, and the boron nitride is etched off of the other side of the wafer. The wafer (10) is then bonded to a pyrex ring (16) using a field assisted thermal bonding process. During the field assisted thermal bonding process, the silicon (11) is bonded directly to the pyrex (16). Then, a zirconium layer (24) is used to cover the mask and is selectively etched where it is desired to remove a circular portion of the silicon. Thereafter the silicon is subjected to a semianisotropic etch. The remaining structure includes a pyrex ring bonded to a silicon ring across which a layer of boron nitride is stretched. The layer of boron nitride is subjected to an annealing process and is then coated with an x-ray opaque material.

61 Claims, 26 Drawing Figures

METHOD FOR PRODUCING A MASK FOR USE IN X-RAY PHOTOLITHOGRAPHY AND RESULTING STRUCTURE

BACKGROUND OF THE INVENTION

1. Field of the Invention

This invention relates to masks used in photolithographic processes for manufacturing integrated circuits, and more particularly to methods for manufacturing masks used in x-ray photolithographic processes.

2. Description of the Prior Art

It is known in the art to use masks during the process of manufacturing integrated circuits. Typical steps taken during the manufacturing of integrated circuits involve coating a silicon wafer with a layer of photoresist, selectively exposing portions of the photoresist and removing the exposed portions. Thereafter, a number of other steps can be taken, e.g., doping the exposed portions of silicon with impurities or depositing metal over the exposed portions. Normally, the process of exposing photoresist involves the use of visible light. However, there is a limit to the resolution that can be achieved with light having a wavelength in the visible portion of the spectrum. It is known in the art that it is desirable to achieve very fine resolution when manufacturing integrated circuits because a finer resolution permits a circuit designer to design integrated circuits using less silicon surface area. This is desirable because processing silicon to make an integrated circuit is expensive and the smaller one can make an integrated circuit, the less expensive it will be.

One method of achieving fine resolution is to use x-ray radiation. An example of a system for manufacturing integrated circuits using x-ray photolithography is discussed in U.S. Pat. No. 3,743,842 (Smith et al.). Masks used in x-ray photolithographic processes typically have a coating which selectively blocks x-rays formed on an x-ray transparent membrane. Because the mask must be capable of producing repeatable geometries of submicron dimensions, the mask must be mechanically strong and constructed with very fine mechanical tolerances. The mask geometries must be capable of being aligned with another set of patterns on a wafer within submicron tolerances.

SUMMARY OF THE INVENTION

In accordance with this invention, a method is provided for manufacturing a mask for use in x-ray photolithographic processes. The mask includes a pyrex ring bonded to a silicon ring. Across the interior opening of the silicon ring is a layer of boron nitride, which is transparent to x-rays. Deposited on the layer of boron nitride is a layer of x-ray opaque material such as gold.

In one embodiment of the invention, a silicon wafer is polished on both surfaces and the polished surfaces are then coated with a layer of boron nitride. A first surface of the boron nitride coated silicon wafer is then covered with a masking substance such as a Dynagrip disk. The boron nitride on the second surface of the silicon wafer is then etched away. The Dynagrip disk masks and protects being underlying boron nitride on the first surface from the etched. After the boron nitride is removed from the second surface of the wafer, the Dynagrip disk is removed. The surface of the wafer from which the boron nitride was removed is bonded to a pyrex ring using field assisted thermal (FAT) bonding. The FAT bond, which requires no epoxy or adhesive, is a bond in which the silicon is directly sealed to the pyrex ring. This bond suffers none of the problems normally associated with epoxies, e.g., weakening with age, weakening with adverse thermal or chemical conditions etc. In one embodiment, the FAT bond is created by placing the wafer against the pyrex ring, raising the temperature of the ring and the wafer to about 190° to 500° C. and providing a voltage between 500 and 1500 V across the silicon-pyrex interface.

After the wafer is bonded to the pyrex ring, a circular portion of the silicon within the wafer is etched away, leaving a boron nitride membrane formed on a silicon ring which is bonded to the pyrex ring. A layer of zirconium sputtered onto the wafer serves as a mask to prevent etching of silicon near the FAT bond. Thereafter, the boron nitride membrane is annealed to achieve a desired tension in the membrane. (As is known in the art, annealing increases the tensile stress in the boron nitride, and is accomplished by heating the membrane.)

A layer of polyimide (which provides added strength to the membrane) and a layer of x-ray opaque material are then deposited on the boron nitride membrane. The x-ray opaque material is then etched in accordance with a desired pattern to form a mask. The mask can then be used to produce desired structures, typically with submicron dimensions, in an integrated circuit.

In accordance with another embodiment of the invention, a first side of a silicon wafer is FAT bonded to a pyrex ring and the wafer and ring are then completely covered with boron nitride. The boron nitride on the first side of the wafer is then etched, thereby exposing a portion of the underlying silicon. The exposed silicon is then removed, leaving an x-ray transparent boron nitride membrane affixed to a silicon ring bonded to a pyrex ring. The boron nitride is then annealed and coated with ppolyimide and a patterned layer of x-ray opaque material as described above.

In another embodiment of the invention, a first side of a glass wafer is FAT bonded to a metal ring which is FAT bonded to a pyrex ring. The resulting structure is then completely covered with boron nitride. A portion of the boron nitride on the first side of the wafer is then removed, thereby exposing a portion of the underlying glass. The exposed glass is then removed, leaving an x-ray transparent boron nitride membrane affixed to a glass ring which is bonded to a pyrex ring support structure via an intermediate metal ring. The boron nitride is then annealed and coated with polyimide and a patterned layer of x-ray opaque material.

In yet another embodiment, a metal ring is sputtered onto a first side of a boron nitride coated silicon wafer. The metal ring is FAT bonded to a pyrex ring. The boron nitride on the second side of the wafer is then removed, thus exposing the underlying silicon. The silicon is then removed, leaving an x-ray transparent boron nitride membrane affixed to a metal ring which is bonded to a pyrex ring. The boron nitride is then annealed and covered with polyimide and a patterned layer of x-ray opaque material as described above.

In another embodiment of the invention, both sides of a silicon wafer are coated with a boron nitride layer. The first side of the wafer is then coated with an x-ray transparent electrically conductive material such as indium tin oxide (ITO). The ITO is FAT bonded to a pyrex ring, and the boron nitride on the second side of the wafer is removed, thus exposing the underlying silicon. The silicon is then removed, leaving a membrane comprising ITO and boron nitride layers affixed to a pyrex ring. The boron nitride is then annealed and covered with polyimide and a patterned layer of an x-ray opaque material.

In another embodiment of the invention, a silicon wafer is coated on both sides with a boron nitride layer which is doped so as to be conductive. The conductive boron nitride layer on the first side of the wafer is FAT bonded directly to a pyrex ring. The boron nitride on the second side of the wafer is removed, thus exposing the underlying silicon. The silicon is then removed, leaving an x-ray transparent boron nitride membrane affixed to a pyrex ring support structure. The boron nitride is then annealed and covered with polyimide and a patterned layer of an x-ray opaque material.

This invention is better understood with reference to the drawings and detailed description below.

DETAILED DESCRIPTION OF THE INVENTION

In accordance with the process of the present invention, both surfaces of a wafer (which in one embodiment is silicon) are coated with a layer of an x-ray transparent material such as boron nitride. The boron nitride layer on a first side of the wafer is subsequently used to support a patterned layer of x-ray opaque material, as will hereinafter become apparent. The boron nitride on the first side of the wafer is covered with a layer of etch stop, which in one embodiment is a Dynagrip disk. The boron nitride on the second side of the wafer is then removed, thus exposing the silicon on the second side of the wafer. The layer of etch stop is then removed, and the exposed silicon is bonded to a support structure (in one embodiment, a pyrex ring) by a field assisted thermal (FAT) bonding process. This is done by placing the exposed silicon against the pyrex ring, heating the wafer and pyrex ring, and applying a voltage across the silicon-pyrex interface.

Thereafter, the to-be-formed mask is coated with a second layer of etch stop (typically zirconium). A circular portion of the second layer of etch stop on the second side of the wafer is removed, thus exposing a portion of the underlying silicon. The exposed silicon is then removed. In one embodiment, a semianisotropic etchant is used to remove the exposed silicon. (A semianisotropic etchant is an etchant which etches along certain directions in a crystal lattice more rapidly than in others, but this difference in etch rates is less pronounced than that exhibited by anisotropic etchants.) The second layer of etch stop is then removed.

At this point, the to-be-formed mask consists of a pyrex ring bonded to a silicon ring covered with a boron nitride membrane. The mask is then coated with a layer of material (typically polyimide) to provide extra mechanical support to the boron nitride membrane. The polyimide layer is then coated with a layer of material (typically tantalum) which bonds to gold and polyimide. The tantalum layer is then coated with a gold layer (which is opaque to x-rays). The gold and tantalum layers are then patterned using conventional techniques.

Figure 1:
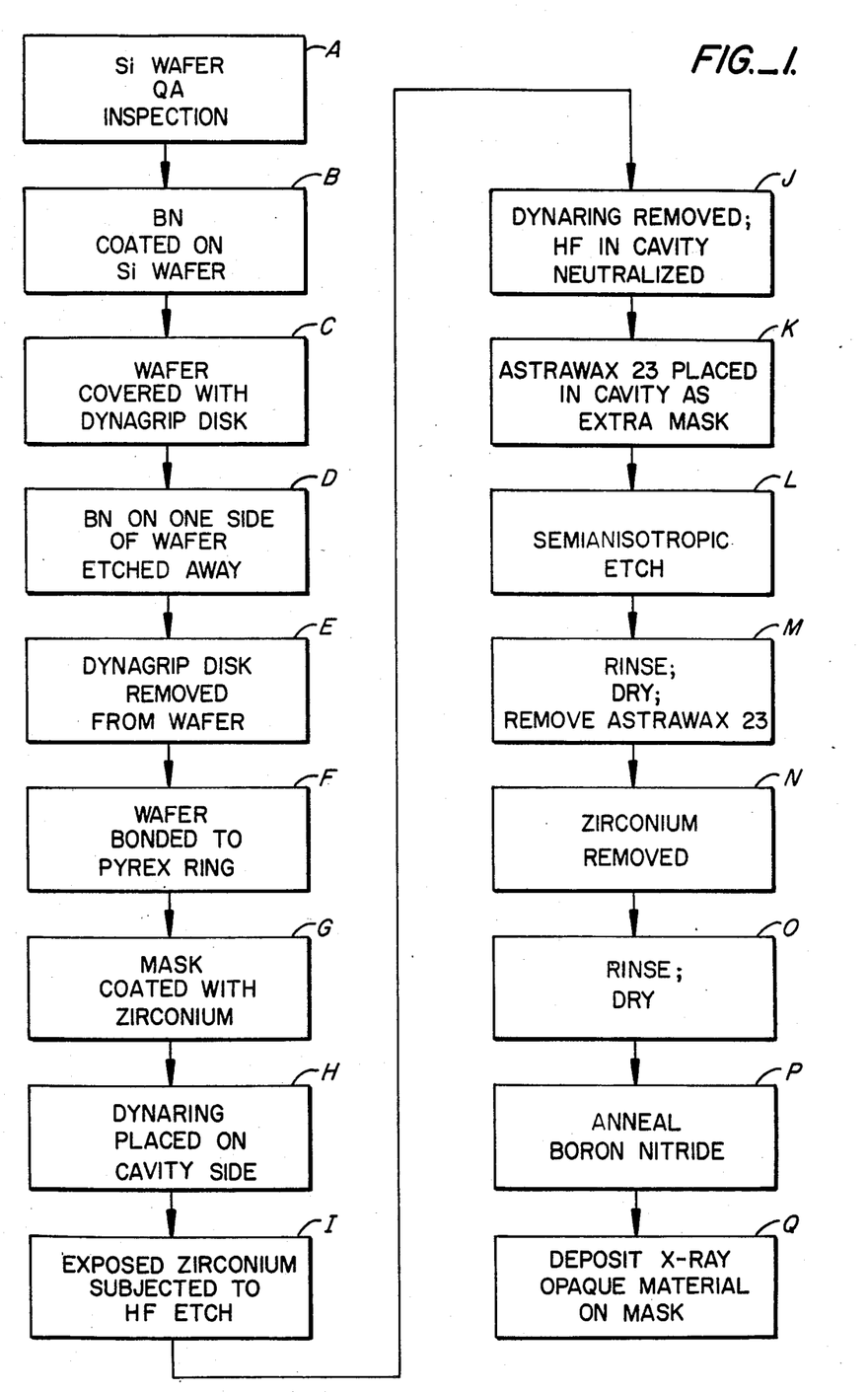
FIG. 1 is a flow chart of the process used in manufacturing a mask in accordance with one embodiment of the present invention.
Figure 2:
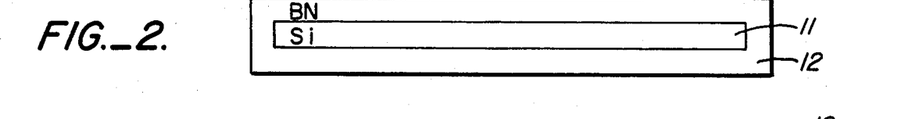
FIG. 2 illustrates in cross section a silicon wafer 10 coated on both surfaces with a layer of boron nitride 12.

The process in accordance with one embodiment of the present invention is illustrated by the flow chart of FIG. 1. The process begins with the step of polishing both sides of a silicon wafer 10 (FIG. 2). In one embodiment, wafer 10 has a diameter of 125 millimeters, a thickness of 625 plus or minus 25 microns, and a [100] crystal orientation. Wafer 10 is either undoped or lightly doped. After a QA inspection (step A in FIG. 1), both surfaces of the wafer are coated with a layer of boron nitride 12 (step B), typically five microns thick. (Hereinafter, the term wafer will be used to mean the silicon wafer and all substances deposited directly or indirectly thereon and the term substrate means just the underlying silicon 11.) In one embodiment of the invention, boron nitride layer 12 is deposited at 340° C. from the flow of diborane and ammonia in a low pressure chemical vapor deposition (LPCVD) process.

It is desirable to remove the boron nitride on one side of wafer 10 without etching any of the boron nitride on the other side of wafer 10. It is known in the art to cover the boron nitride 12 on one side of wafer 10 with a layer of etch stop so that the uncovered boron nitride on the other side of wafer 10 may then be removed without damaging the boron nitride covered by the etch stop. In the prior art, this is typically done by spinning a film of etch stop onto the wafer. If the etch stop does not completely coat the layer of boron nitride, a pin hole can develop in the coated boron nitride during the etching process. This pin hole could be a fatal defect, making the mask useless. Accordingly, it has been found that a Dynagrip disk 14 (FIG. 3) having a 5 inch diameter placed on one side of wafer 10 (step C of FIG. 1), will act as an etch stop that prevents pin holes from developing. This disk is part No. 714525, manufactured by Dynatek of Redwood City, Calif. The Dynagrip disk includes a layer of approximately 0.005 inch thick polyethylene coated with a wax. Dynagrip disk 14 is applied to boron nitride 12 on one side of wafer 10 after wafer 10 is heated to approximately 120° C. A wax such as Dynatek Soft Blue Overlay Adhesive is applied to seal the edge 15 between Dynagrip disk 14 and boron nitride 12.

Next, the exposed portion of boron nitride 12 is etched away (step D of FIG. 1) by soaking wafer 10 in a solution having a temperature between 20° and 40° C. that is 12.5 to 14.5% sodium hypochlorite and the remainder water. Wafer 10 remains in this solution until the exposed portion of boron nitride 12 is removed. Dynagrip disk 14 serves as an etch stop during this process.

After the exposed boron nitride 12 has been removed from one side of wafer 10, Dynagrip disk 14 is removed by heating the wafer to about 120° C. and lifting the disk off (step E of FIG. 1). The residual wax is dissolved, for example, in a solution of trichloroethylene or xylene at room temperature.

Figure 4:
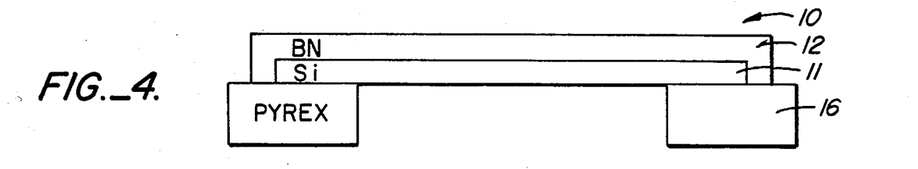
FIG. 4 illustrates in cross section the wafer of FIG. 3, one surface of which is coated with boron nitride 12 and the other surface of which is bonded to a pyrex ring 16.

Next, wafer 10 is affixed to a pyrex ring 16 using FAT bonding (step F of FIG. 1). FIG. 4 illustrates wafer 10 bonded to pyrex ring 16. Pyrex ring 16 has a coefficient of thermal expansion which approximately matches that of silicon substrate 11. Accordingly, pyrex ring 16 is made from a type of pyrex such as type number 7740 pyrex available from Corning Glass Co. of Corning, N.Y. The bond between substrate 11 and pyrex ring 16 requires no adhesive and is created by placing silicon substrate 11 and pyrex ring 16 so that they push against each other, heating wafer 10 and pyrex ring 16 to a temperature between 190° and 500° C., and applying several hundred volts across the silicon-pyrex interface in a manner to be described below. In one embodiment, a voltage of 1300 volts is applied during this process and a furnace temperature of 340° to 350° C. is used. Pyrex ring 16 and wafer 10 remain in the furnace with the voltage applied for approximately 80 minutes and then are removed. Prior to the FAT bonding process, it is important that the pyrex ring being bonded to substrate 11 is polished and clean.

Figures 5, 6, 7:
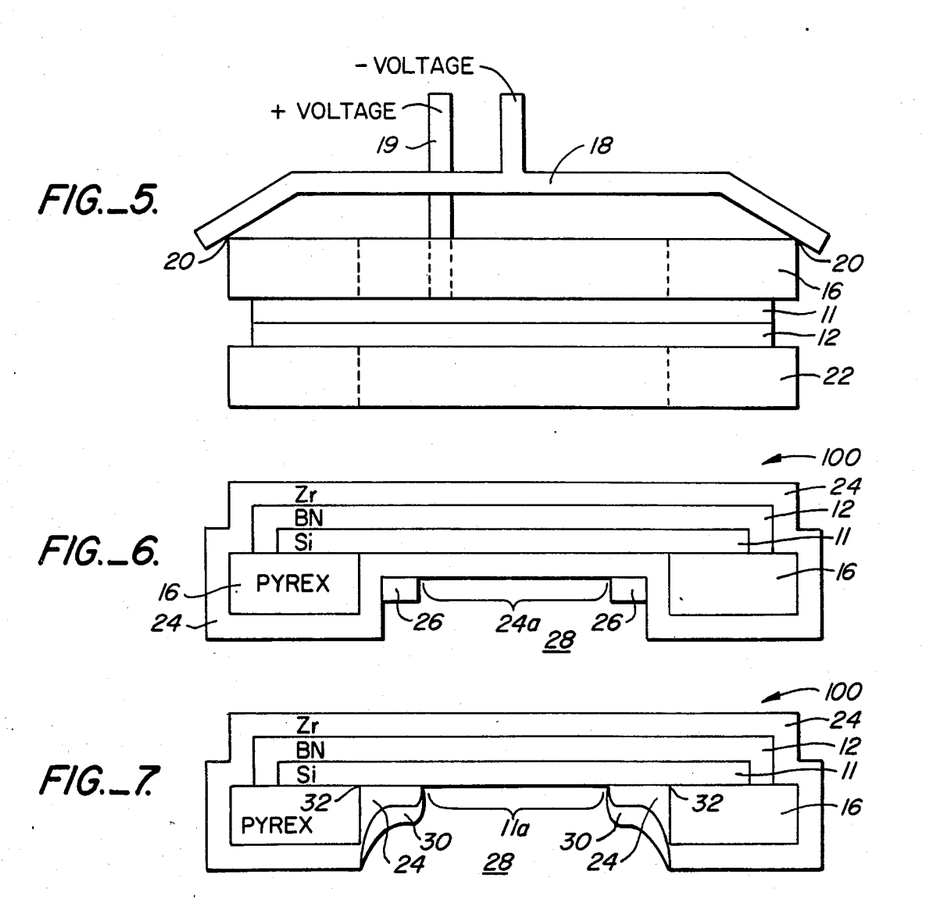
FIG. 5 illustrates in cross section the apparatus used to bond pyrex ring 16 to wafer 10.
FIG. 6 illustrates in cross section the structure of FIG. 4 (mask 100) covered with a zirconium layer 24.
FIG. 7 illustrates in cross section mask 100 after a portion of the zirconium is removed by an HF etch.

FIG. 5 illustrates the apparatus used to produce the FAT bond. Referring to FIG. 5 it is seen that while in the furnace, pyrex ring 16 is connected to a metal spider 18 at a corner region 20. A negative voltage is applied to pyrex ring 16 via metal spider 18, while a positive voltage is applied to substrate 11 via a terminal 19. A 600K ohm resistor is placed in series with metal spider 18. The point at which spider 18 contacts pyrex ring 16 is usually pitted during the FAT bonding process. Accordingly, it is desirable to have this contact area as small as possible without affecting the bonding to minimize any cosmetic problems.

Also, with reference to FIG. 5, a second pyrex ring 22 is placed against boron nitride layer 12. Ring 22 protects boron nitride layer 12 from mechanical or electrical damage during the FAT bonding process from contact with the bottom of the furnace.

FAT bonding provides several benefits that are not available from the more conventional epoxy bonds. For example, the FAT bond is resistant to alkali and acid etches. In addition, the FAT bond does not exhibit any of the aging problems which afflict epoxy bonds, nor do FAT bonds exhibit problems in high temperature environments. Once wafer 10 is bonded to pyrex ring 16, the resulting structure, although not yet completed, comprises mask 100 (FIG. 4).

Referring to FIG. 6, after the FAT bond process, a zirconium layer 24 is sputtered onto all surfaces of mask 100 (step G in FIG. 1). In one embodiment, zirconium layer 24 is 800 to 1000 Å thick, and is used as an etch stop during a subsequent KOH silicon etch. The KOH etch is used to remove a portion of silicon substrate 11 as described below.

Figure 3:
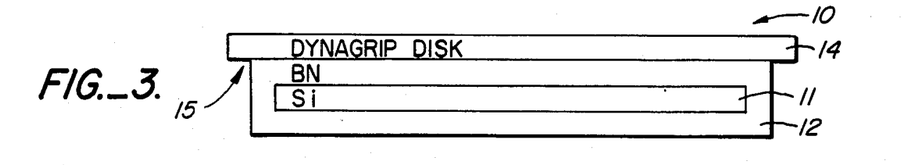
FIG. 3 illustrates in cross section wafer 10 of FIG. 2, one surface of which is covered by a Dynagrip disk 14.

After forming zirconium layer 24, a mask layer 26 is deposited over zirconium layer 24 as illustrated in FIG. 6 (step H of FIG. 1). In one embodiment, mask layer 26 is a Dynagrip ring, which is merely a ring made from the same material as Dynagrip disk 14 (FIG. 3).

After Dynagrip ring 26 is applied to mask 100, a 1% HF solution is applied to cavity 28 of mask 100 for about 15 seconds (Step I of FIG. 1) to remove a portion 24a of zirconium layer 24 as illustrated in FIG. 6. After portion 24a of zirconium layer 24 is removed, the remaining HF solution in cavity 28 is neutralized with a diluted KOH solution so that it will not damage the unprotected portions of zirconium layer 24 if it is spilled (step J of FIG. 1). After that, any neutralized HF solution is removed from cavity 28, and Dynagrip ring 26 is also removed by heating mask 100 to about 130° C. Cavity 28 is then rinsed with xylene.

Referring to FIG. 7, the region in cavity 28 near where the silicon substrate 11 is bonded to pyrex ring 16 is then covered by a mask material 30, such as Astrawax 23 which is a bistearamide wax available from the Durachem Corporation (step K of FIG. 1). Astrawax 23 is used to effectively mask the corner of the FAT bond. When sputtering zirconium 24 onto mask 100, it is difficult to cover the crevice 32 where the silicon meets the pyrex. Accordingly, the wax is used to cover crevice 32. This is done because during a subsequent silicon etch process described below, it is desirable to avoid etching the silicon near the FAT bond since the silicon near the FAT bond is under a mechanical stress. Astrawax 23 layer 30 thus serves as an additional mask during silicon etching.

After the appropriate masking substances are applied to mask 100, the a portion 11a of substrate 11 is etched away. In a preferred embodiment of the invention, this is done by soaking to-be-formed mask 100 in a semianisotropic etchant (step L of FIG. 1).

As is known in the art, there are isotropic etchants and anisotropic etchants that can be used to etch silicon. An example of an anisotropic etchant is KOH. Anisotropic etchants etch at one rate along preferred direction in a crystal lattice while etching at a much slower rate along other directions in the crystal lattice. The etch rate along the preferred direction can be as much as 100 times the etch rate along an unpreferred direction. This can cause several problems, e.g., the formation of pyramids when etching silicon (see U.S. Pat. No.

Figure 8:
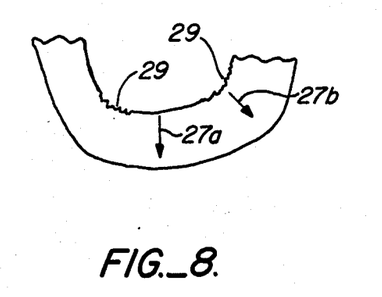
FIG. 8 illustrates in top view the step pattern caused by using an anisotropic etchant to etch a circular pattern in crystalline material.

3,738,881, issued to Erdman, et al.), and the formation of pyramid-shaped etch pits. In addition, it is desirable etch a circular hole having a diameter of about 100 mm in substrate 11. Because of the directional preference of anisotropic etchants, when using an anisotropic etchant to etch circular holes, a step pattern, such as step pattern 29 illustrated in FIG. 8, is produced. Obviously, if a circular hole is desired, step pattern 29 is undesirable. (Although there are isotropic etchants which do not etch along preferred axes, as is known in the art, these isotropic etchants are difficult to control). To overcome these problems an oxidizing agent is used in the KOH etchant which increases the etch rate in the direction (direction [110] in the crystal lattice) that anisotropic KOH etchant normally etches at a slower rate. This prevents the formation of the step pattern illustrated in the plan view of FIG. 8. Because of this, a smooth contour is etched into the silicon. In a preferred embodiment, potassium chromate is used as the oxidizing agent. Potassium chromate is mixed in the KOH etchant in a 0.01 molar concentration. Although the KOH-potassium chromate solution etches more slowly in the direction indicated by arrow 27b than in the direction indicated by arrow 27a, this effect is less pronounced than the step pattern effect.

Figure 10:
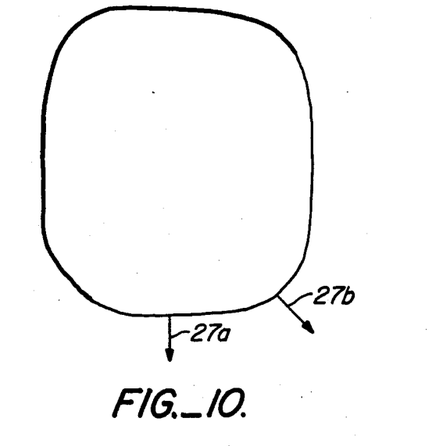
FIG. 10 is a top view of a window in a zirconium mask used to provide a circular hole during a silicon etch process.

In one embodiment of the invention, layer of zirconium 24 can be etched in a distorted circular shape to compensate for the slower etching of silicon along the direction of arrow 27b (FIG. 8). In such an embodiment, removed portion 24a of zirconium layer 24 has a shape such as that illustrated in FIG. 10. In another embodiment of the invention, an anisotropic etchant is used including a KOH solution mixed with a compound such as model number FC129 manufactured by 3M Corporation. FC129 is a surfactant which removes bubbles of hydrogen that form during the etching process away from the surface of the silicon so that fresh etchant can come into contact with the silicon.

During the previous silicon etch step, mask 100 is removed from the KOH etchant before the desired hole is completely etched in silicon substrate 11. Accordingly, mask 100 is then subjected to a slow silicon etch to remove the remaining undesired part of silicon substrate 11. Specifically, during the start of the etching process, silicon substrate 11 is approximatey 24.6 mils thick. During the first KOH etching process, 22 of the 24.6 mils of silicon substrate 11 are removed. Mask 100 is then subjected to a slow KOH etch which removes the remaining 2.6 mils. This is done because during the fast etch process, bubbles are formed on the surface of the silicon and gas accumulates in cavity 28. When etching the remaining 2.6 mils of silicon, it is desired to etch at a slower rate so that bubbles and gas pressure do not push against boron nitride layer 12. This is typically done by lowering the temperature of the KOH solution. (During the fast silicon etch, the KOH solution is at 95° C., and during the slow etch, it is at about 80° C.)

After portion 11a of silicon substrate 11 is removed, Astrawax 23 layer 30 is stripped off with a solvent such as xylene. Then, remaining zirconium layer 24 is removed with an HF etch. This etch is accomplished by immersing mask 100 in an HF solution for 10 to 15 seconds, which is sufficient time to remove zirconium layer 24 without damaging pyrex ring 16.

After the slow silicon etch, the tension in boron nitride membrane 12 is measured in a manner described below. Because boron nitride membrane 12 is subsequently used to support a patterned layer of x-ray opaque material which must be aligned within submicron tolerances, it is necessary that membrane 12 be under tension so it cannot move with respect to the rest of mask 100.

If the tensile stress in membrane 12 is inadequate, it is annealed (a process which increases the tension) by heating mask 100. Accordingly, after the slow silicon etch, the tension in boron nitride membrane 12 is measured to determine the amount of annealing required. This is done by using the apparatus illustrated in FIG. 11.

Figure 11:
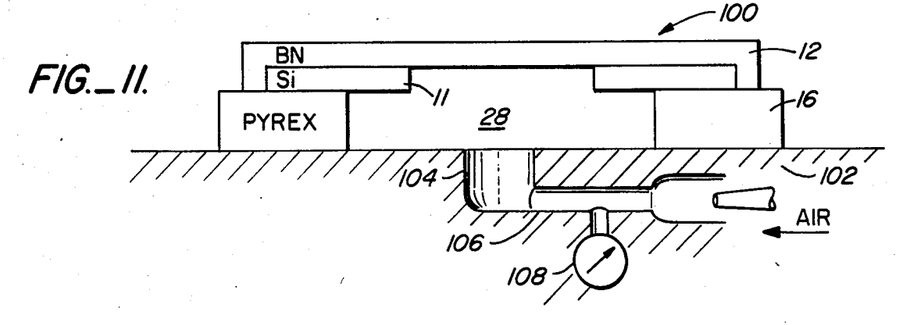
FIG. 11 illustrates apparatus used to measure the stress in a boron nitride membrane.

Referring to FIG. 11, to-be-formed mask 100 is placed on a platform 102. The pyrex-platform interface forms an air-tight seal. In the center of platform 102 is a sintered bronze plug 104 which is coupled to a pipe 106. Affixed to pipe 106 is a pressure meter, e.g., a differential capacitance manometer 108 which measures the air pressure in pipe 106. Air is forced into pipe 106 which enters the cavity between platform 102 and boron nitride membrane 12. Because of the difference in air pressure on each side of boron nitride membrane 12, the membrane height changes. This change in height can be measured by any of a number of techniques. For example, laser interferometry can be used to measure the change in height at the center of the boron nitride membrane 12.

In another embodiment, a microscope can be used to measure the difference in height in boron nitride membrane 12. This can be done, for example, by (1) focusing a microscope on boron nitride membrane 12 without the increased air pressure in pipe 106, (2) increasing the pressure in pipe 106 and (3) refocusing the microscope. By calibrating the microscope to provide a measurement of the height of membrane 12 versus the position the eyepiece must be in to focus the microscope on membrane 12, the height displacement is measured. Other techniques can be used to measure the displacement of membrane 12 as well.

Once the height displacement in membrane 12 is measured, the tension can be calculated by the following formula:

$$\Delta P = \frac{4t\sigma h}{r^2} + \frac{8t}{3r^4} \cdot \frac{Eh^3}{(1-\nu)}$$

where
$\Delta P$ = pressure difference
$r$ = radius of the membrane 12
$h$ = height differential
$t$ = film thickness
$\sigma$ = tensile stress
$E$ = Young's Modulus
$\nu$ = Poisson's ratio.

It is desirable to have a tensile stress between $6 \times 10^8$ dynes per centimeter and $10 \times 10^8$ dynes per centimeter in membrane 12.

After the above-described tension measurement, layer of boron nitride 12 is annealed (step P, FIG. 1). This is typically done by heating mask 100 to a temperature approximately 40° C. above the temperature at which boron nitride layer 12 was deposited (in one embodiment, 380° C.) until the boron nitride has a tension in the desired range.

Figure 9:
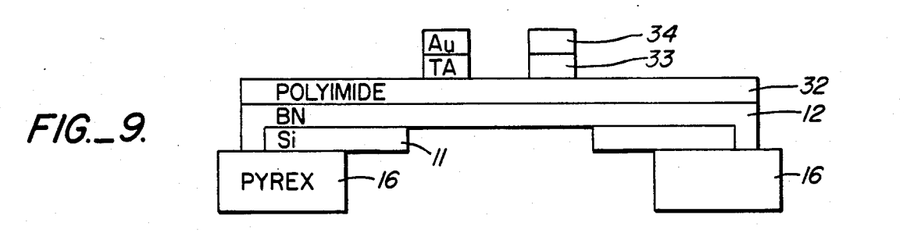
FIG. 9 illustrates in cross section a mask provided by a process in accordance with the present invention.

After annealing, a polyimide layer 32 (FIG. 9) is formed on boron nitride membrane 12 to provide added mechanical strength to the membrane and to facilitate bonding to tantalum layer 33. Tantalum layer 33 (which bonds to both polyimide and gold) and a gold layer 34 (which is x-ray opaque) are then deposited on polyimide layer 32. Gold and tantalum layers 33, 34 are then patterned in a known manner, e.g., as described in "Advances in X-ray Mask Technology," by Alex R. Shimkunas, published in Solid State Technology, pages 192 to 199, in September 1984, incorporated herein by reference. In this way mask 100 is formed which includes a pyrex support 16 bonded to a silicon ring 11. Silicon ring 11 is covered with x-ray transparent boron nitride membrane 12 and polyimide layer 32. Polyimide 32 is covered by patterned gold layer 34. Similarly patterned adhesive tantalum layer 33 is provided between gold layer 34 and polyimide layer 32. Mask 100 can then be used in the manufacturing of integrated circuits.

Figure 12:
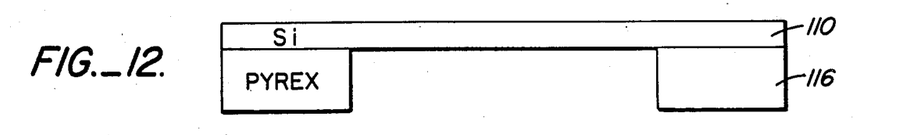
FIGS. 12 through 15 illustrate in cross section a mask during a manufacturing process in accordance with another embodiment of the invention in which a wafer is bonded to a pyrex ring before being coated with boron nitride.
Figure 13:
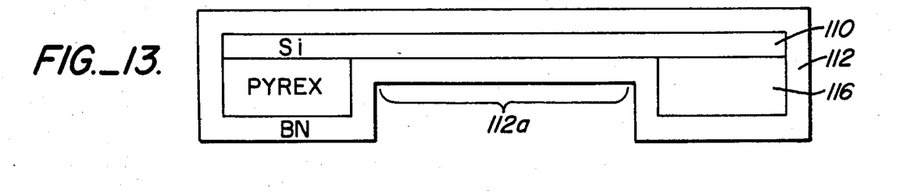
Figure 14:
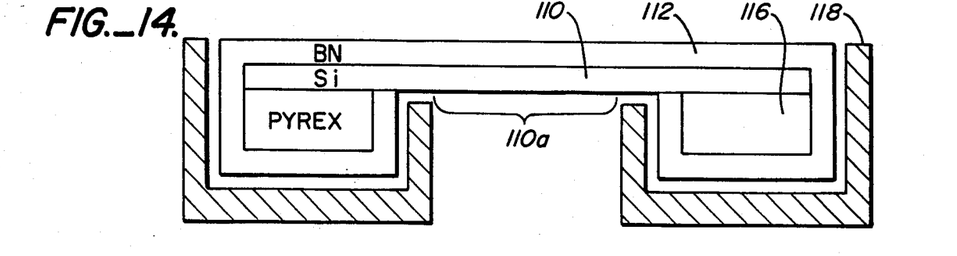

Referring to FIGS. 12 through 15, a process in accordance with a second embodiment of the invention is illustrated. Referring FIG. 12, a silicon substrate 110 is bonded to a pyrex ring 116 before any boron nitride is deposited thereon. Substrate 110 and pyrex ring 116 are of the same type as in the previous embodiment and are bonded using the FAT bonding technique described above. Thereafter, the structure of FIG. 12 is completely coated with a layer of boron nitride 112 as illustrated in FIG. 13. Boron nitride 112 is between 3 and 5 microns thick and is deposited in the same manner as boron nitride layer 12 discussed above. As in the previous embodiment, boron nitride layer 112 supports a subsequently deposited patterned layer of x-ray opaque material.

Thereafter, a portion 112a of boron nitride layer 112 is removed through any of a number of techniques, e.g., the above-described chemical etch or a plasma etch. In addition, in one embodiment of the invention, a sodium bicarbonate bead blast etch process is used. In accordance with this embodiment, a mechanical fixture 118 (FIG. 14) is placed over part of the mask as illustrated and sodium bicarbonate beads are propelled towards portion 112a of boron nitride layer 112. This is done, for example, using apparatus such as model number 6500 available from S. S. White Industrial Products of Piscataway, N.J. The sodium bicarbonate beads are model number 354-1620Y, also available from S. S. White Industrial Products. (Of importance, sodium bicarbonate is water soluble so that residual sodium bicarbonate can be removed from the mask with water.)

Figure 15:
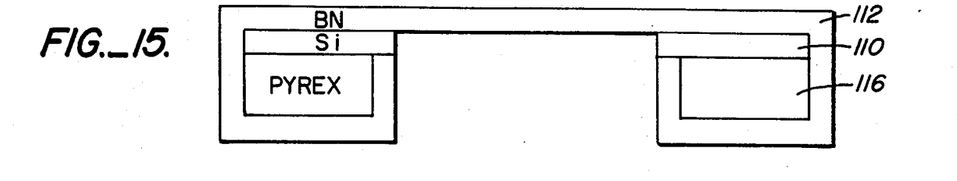

Thereafter, a portion 110a of silicon substrate 110 (exposed by the removal of portion 112a of boron nitride layer 112) is removed by soaking the to-be-formed mask in either an HNA or a KOH solution. Boron nitride layer 112 acts as a mask to protect the pyrex ring during the silicon etch. The resulting structure is illustrated in FIG. 15. Thereafter, the process proceeds as in the previous embodiment of the invention, i.e., boron nitride 112 is annealed, and coated with polyimide, tantalum and gold (not shown). The tantalum and gold layers are then patterned.

Figure 16:
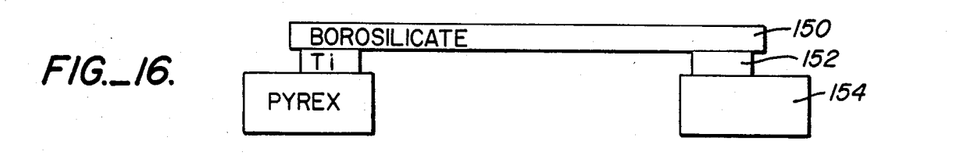
FIGS. 16 through 19 illustrate in cross section a mask during a manufacturing process in accordance with another embodiment of the invention during which a glass substrate, a metal ring, and a pyrex support structure are FAT bonded together.

In accordance with another embodiment of the invention, instead of starting with a silicon substrate 110, one starts with a glass wafer such as borosilicate substrate 150 (FIG. 16). Borosilicate substrate 150 typically has a diameter of about 125 millimeters and a thickness of about 625 microns plus or minus 25 microns but other diameters and thicknesses can be used as well. In accordance with the process of this embodiment, a FAT bond is created between borosilicate substrate 150 and a metal ring 152 and simultaneously a FAT bond is created between metal ring 152 and pyrex ring 154. In one embodiment, metal ring 152 is titanium, but other metals, e.g., aluminum, zirconium, tantalum or niobium can be used. The FAT bond is created by placing borosilicate substrate 150, titanium ring 152 and pyrex ring 154 so they push against ech other, providing a voltage of about 1300 volts across the titanium-borosilicate interface and the titanium-pyrex interface and heating borosilicate substrate 150, titanium ring 152 and pyrex ring 154 to a temperature between 340° to 350° C.

Figure 17:
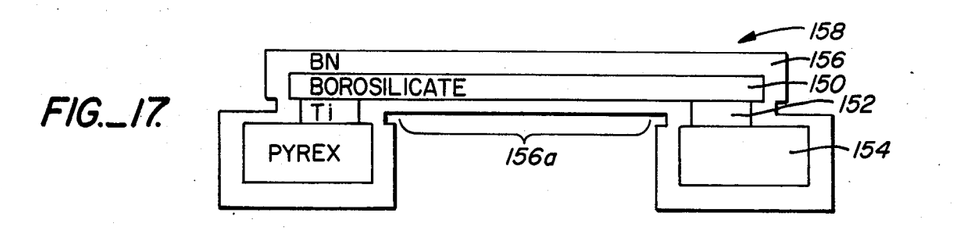
Figure 18:
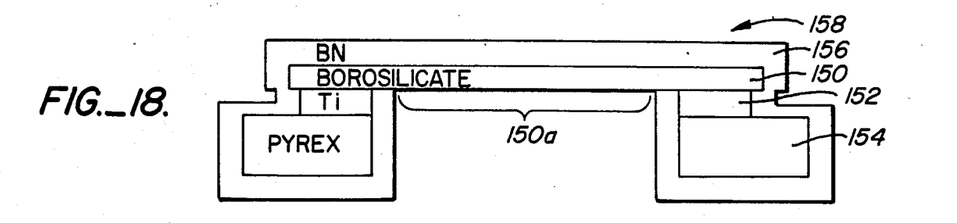
Figure 19:
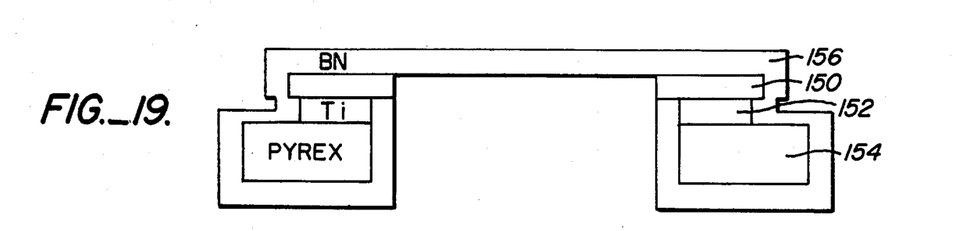

The resulting structure is then coated with a boron nitride layer 156 via an LPCVD process (FIG. 17). Boron nitride layer 156 is typically 3 to 5 microns thick. Thereafter, a portion 156a of boron nitride layer 156 is removed as in the previous embodiments to expose a circular portion 150a of borosilicate substrate 150 (FIG. 18). Exposed portion 150a of borosilicate substrate 150 is then removed by soaking to-be-formed mask 158 in an HF solution having a concentration of 100% and a temperature of 70° C. (A 100% HF solution is defined as a solution that is 49% HF by weight, i.e., the standard HF reagent concentration.) During this process, remaining portion of boron nitride layer 156 protects pyrex ring 154. The resulting structure is illustrated in FIG. 19. Thereafter, boron nitride membrane 156 is annealed, coated with layers of polyimide, tantalum and gold, and the gold and tantalum layers are patterned as described above.

Figure 20:
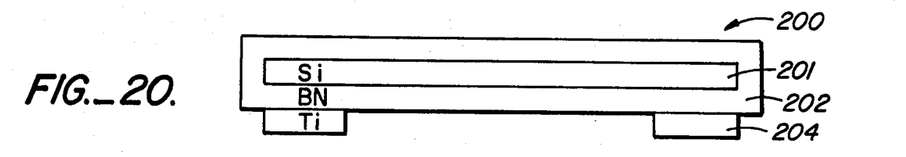
FIGS. 20 through 22 illustrate in cross section a mask during a manufacturing process in accordance with another embodiment of the invention in which a metal ring structure is formed on a boron nitride coated wafer which is FAT bonded to a pyrex ring.

In accordance with yet another embodiment of the invention, a silicon wafer 200 (FIG. 20) is coated on both sides with a layer of boron nitride 202 using the LPCVD process described above. A layer of metal 204, such as titanium, is then formed on one side of wafer 200, e.g., by sputtering or evaporation, to a thickness of 1000 Å. Metal layer 204 is then covered with a photoresist layer (not shown) which is patterned in a conventional manner, thereby exposing a centrally located circular portion of metal layer 204. The exposed portion of metal layer 204 is then removed, leaving a metal ring 204 on the surface of boron nitride layer 202. The photoresist layer is then removed. Metal ring 204 is then bonded to a pyrex ring 208 using the FAT bonding process described above.

Figure 21:
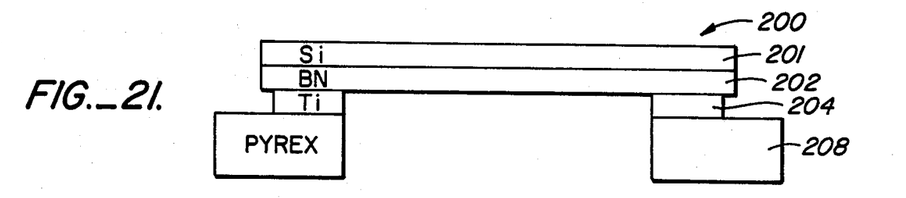
Figure 22:
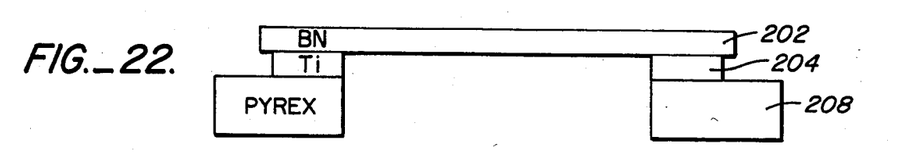

Referring to FIG. 21, the boron nitride on top of substrate 201 is etched, e.g., using either a plasma, a bead blast etching technique, or a chemical etchant. During this process, the boron nitride on the bottom of wafer 200 (i.e., the side facing pyrex ring 208) is protected by a mechanical masking fixture. Thereafter, the entire silicon substrate 201 is removed by soaking the structure of FIG. 21 in a KOH solution of HNA (hydroflouric-nitric-acetic acid solution), while protecting pyrex ring 208 with photoresist or a mechanical masking fixture. The resulting structure includes boron nitride membrane 202 affixed to metal 204 which in turn is affixed to pyrex ring 208 as illustrated in FIG. 22. Then the boron nitride is annealed and covered with polyimide, tantalum and gold as described above. Of importance, the surface of membrane 202 which is covered with polyimide, tantalum and gold is free of hillocks, since it replicates the shape of removed substrate 201. Therefore, the surface of membrane 202 is smoother than in prior art masks.

Figure 23:
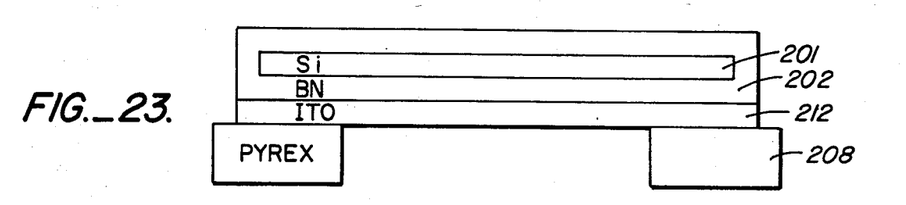
FIGS. 23 through 25 illustrate in cross section a mask during a manufacturing process in accordance with another embodiment of the invention in which a layer of indium tin oxide is formed on a boron nitride coated wafer.

In yet another embodiment of the invention, instead of covering one side of boron nitride coated substrate 201 with titanium layer 206, an indium tin oxide layer (ITO) 212 is deposited on one side of the wafer to a thickness of 500 U (FIG. 23). ITO layer 212 is either sputtered or evaporated onto boron nitride layer 202.

Because ITO layer 212 is conductive, a FAT bond can be provided between ITO layer 212 and pyrex ring 208 using the same temperature, time, and voltage used in the previous embodiments.

Figure 24:
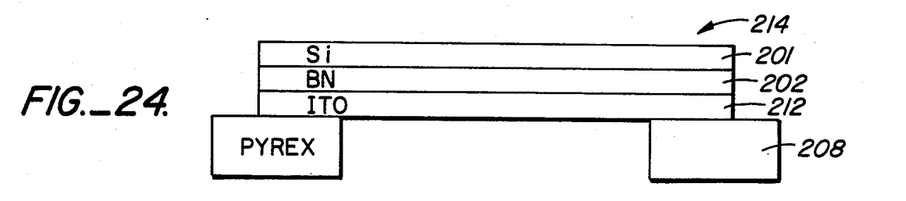
Figure 25:
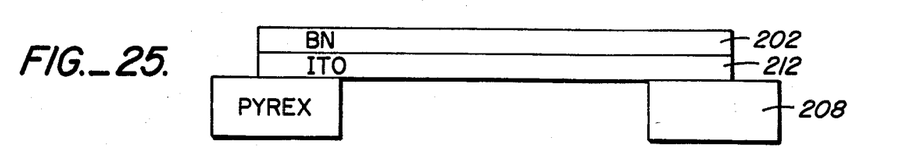

Thereafter, the boron nitride 202 on top of silicon substrate 201 is removed as described above leaving the structure illustrated in FIG. 24 (to-be-formed mask 214). Thereafter, mask 214 is soaked in a KOH or HNA solution to remove silicon substrate 201, leaving the structure of FIG. 25. Of importance, because ITO layer 212 is thin, and is therefore transparent to x-rays and visible light, it need never be etched or removed. Accordingly, boron nitride layer 202 is then annealed and coated with polyimide, tantalum and gold. The tantalum and gold are then patterned as described above. In an alternative embodiment, the part of ITO layer 212 not bonded to pyrex ring 208 is removed using standard masking and etching tecniques.

Figure 26:
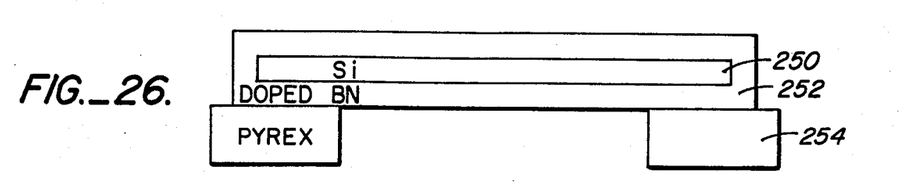
FIG. 26 illustrates in cross section a mask during a manufacturing process in accordance with another embodiment of the present invention in which a wafer is coated with a conductive layer of titanium-doped boron nitride.

In accordance with yet another embodiment of the invention, both sides of a silicon substrate 250 are coated with a layer of boron nitride 252 as illustrated in FIG. 26. In accordance with this embodiment of the invention, boron nitride layer 252 is doped with titanium. This is typically done by adding organo-titanium reactant to the process gas during the LPCVD process. Such processes use 25 to 30 SCCM of ammonia, 60 to 70 SCCM diborane, and 540 to 600 SCCM of N2. (1 SCCM equals one cubic centimeter per minute at 1 atmosphere.) This process takes place at 340° C. In one embodiment of the invention, 2 to 5 SCCM of TiF4 or tetramethyltitanium is added to the process gas mixture. In another embodiment, 25 to 50 SCCM of H2 and 2 to 5 SCCM of either titanium isopropoxide or tetraethoxy titanium are added to the process gas mixture. The hydrogen is added to avoid oxygen in the boron nitride. The doped boron nitride layer is typically 3 to 5 microns thick. In accordance with this embodiment of the invention, the FAT bond is created between titanium doped boron nitride layer 252 and a pyrex ring 254. This is done by placing the pyrex ring 254 against boron nitride layer 252, providing a voltage of approximately 1300 volts across the boron nitride-pyrex interface, and heating boron nirode-coated substrate 250 and pyrex 254 to a temperature between 340° and 350° C. Thereafter, the boron nitride 252 on one side of substrate 250 is removed as described above, thus exposing substrate 250. Then, substrate 250 is removed, leaving titanium-doped boron nitride membrane 252 bonded to pyrex ring 254. The boron nitride is then annealed, as described above, covered with polyimide, tantalum and gold, and the tantalum and gold layers are patterned as described above.

While the invention has been described with reference to specific embodiments, those skilled in the art will recognize that minor changes and modifications can be made to this process without departing from the spirit and scope of the invention. For example, instead of using as a silicon substrate, a glass substrate such as borosilicate, aluminoborosilicate, fused silica, or other form of glass can be substituted. (Borosilicate is easiest to FAT bond to silicon. Aluminoborosilicate and fused silica require an intermediate metal layer.) Accordingly, all such modifications come within the scope of the invention.

We claim:

1. A method for manufacturing a mask for use in a photolithograhic process, the method comprising the steps of:

coating both surfaces of a wafer with layers of boron nitride;

covering one surface of the boron nitride coated wafer with an etch stop; and removing a portion of the boron nitride with a sodium hypochlorite solution.

2. The method of claim 1 wherein said step of depositing a layer of boron nitride is done using a low pressure chemical vapor deposition process.

3. The method of claim 1 wherein said etch stop comprises a polyethylene disk.

4. The method of claim 3 further comprising the step of removing said polyethylene disk after said portion of boron nitride is removed.

5. The method of claim 1 wherein said etch stop comprises a wax coated plastic sheet.

6. A method for manufacturing a mask for use in a photolithographic process, the method comprising the steps of:

covering both surfaces of a wafer with a layer of x-ray transparent material;

providing a solid layer of material;

covering one side of the coated wafer wth said solid layer of material, said solid layer of material serving as an etch stop, x-ray transparent material on the other side of the wafer remaining exposed, said step of covering one side being performed after said step of providing a solid layer; and etching the exposed x-ray transparent material.

7. A method for manufacturing a mask for use in a photolithographic process comprising the step of bonding a glass ring to a silicon substrate, said bonding being done with a field assisted thermal bonding process.

8. A method for manufacturing a mask comprising the steps of:

providing a wafer of crystalline material having one side covered by a x-ray transparent layer;

covering a portion of said wafer with an etch stop; and subjecting said wafer to a semianisotropic etchant.

9. The method of claim 7 wherein said silicon substrate has a layer of boron nitride on one side.

10. The method of claim 7 wherein said field assisted thermal bonding process is accomplished by providing an electrical potential between said silicon substrate and said glass ring.

11. The method of claim 10 wherein said field assisted thermal bonding process is accomplished at a temperature between 340° and 350° C.

12. The method of claim 11 wherein a voltage of approximately 1300 volts is placed across said silicon substrate and said glass ring.

13. The method of claim 12 wherein said glass ring and said silicon substrate remain at a temperature between 340° and 350° C. for approximately 80 minutes.

14. The method of claim 12 wherein said voltage is applied at a corner of said glass ring.

15. A method for manufacturing a mask for use in a photolithographic process comprising the steps of:

providing a wafer of a first material having one side coated with a layer of x-ray transparent material;

coating a portion of the surface of said wafer with a layer of zirconium, said layer of zirconium having an opening through which a portion of said first material is exposed; and etching said exposed portion of said first material, said layer of zirconium acting as an etch stop.

16. The method of claim 15 wherein said silicon is etched with a KOH solution.

17. The method of claim 15 wherein said silicon wafer having one side coated with a layer of boron nitride is bonded to a glass ring.

18. The method of claim 17 wherein said silicon is bonded to a glass ring using a process of field assisted thermal bonding.

19. The method of claim 18 further comprising the steps of:
depositing a second masking substance over a first portion of said layer of zirconium, said second masking substance serving as an etch stop, a second portion of said layer of zirconium remaining exposed; and
removing said second portion.

20. The method of claim 19 wherein said second masking substance is a polyethylene ring.

21. The method of claim 20 further comprising the step of coating a portion of said layer of zirconium and said glass ring with a third masking substance.

22. The method of claim 21 wherein said third masking substance is Astrawax 23, said third masking substance protecting a portion of said silicon during said step of etching said exposed portion of said silicon.

23. The method of claim 15 wherein said silicon wafer is bonded to a glass ring, said step of etching comprises the step of applying a KOH solution to said exposed portion of said silicon, and said layer of zirconium protects said glass ring during said step of etching.

24. A method for manufacturing a mask for use in a photolithographic process comprising the steps of:
providing a silicon wafer having a layer of boron nitride coated on one side;
covering a portion of said silicon wafer with an etch stop; and
subjecting said wafer to a semianisotropic etchant.

25. The method of claim 24 wherein said etchant comprises KOH and an oxidizing agent.

26. The method of claim 25 wherein said oxidizing agent is potassium chromate.

27. The method of claim 26 wherein said potassium chromate has a concentration of approximately 0.01 molarity.

28. A mask for use in photolithography comprising:
a silicon ring;
an x-ray transparent layer of material supported by said silicon ring;
a glass ring bonded to said silicon ring, said bond being produced by a field assisted thermal bonding process.

29. A method for manufacturing a mask comprising the steps of:
bonding a substrate to a support structure with a field assisted thermal bond;
coating said substrate with a layer of material; and
removing a portion of said substrate, thereby leaving a membrane of said material affixed to the remaining portion of said substrate, said remaining portion being bonded to said support structure.

30. The method of claim 29 wherein said substrate is a silicon wafer, said support structure is glass, and said material is boron nitride.

31. The method of claim 30 further comprising the step of forming a patterned layer of x-ray opaque material on said membrane.

32. A method for manufacturing a mask comprising the steps of:

bonding a substrate to a conductive member with a field assisted thermal bond, said member having a centrally located aperture therein;
bonding said conductive member to a support structure with a field assisted thermal bond;
coating at least one side of said substrate with a layer of x-ray transparent material; and
removing a portion of said substrate, thereby leaving a membrane of said x-ray transparent material affixed to the remaining portion of said substrate, said remaining portion of said substrate being bonded to said conductive member, said conductive member being bonded to said support structure.

33. The method of claim 32 wherein said conductive member is a metal ring, said support structure is a glass ring, and said substrate is a glass wafer.

34. A mask comprising:
a glass ring;
a metal ring bonded to said glass ring with a field assisted thermal bond;
an x-ray transparent membrane affixed to said glass ring; and
a support structure bonded to said metal ring with a field assisted thermal bond.

35. The mask of claim 34 wherein said support structure is a glass ring, said mask further comprising a patterned x-ray opaque layer of material formed on said x-ray transparent membrane.

36. A method for manufacturing a mask comprising the steps of:
coating a substrate with a layer of x-ray transparent material;
forming a conductive ring on said layer of x-ray transparent material on one side of said substrate;
bonding said conductive ring to a support structure with a field assisted thermal bond; and
removing said substrate.

37. The method of claim 36 wherein said conductive ring is metal sputtered onto said layer of x-ray transparent material.

38. The method of claim 36 wherein said conductive ring is metal evaporated onto said layer of x-ray transparent material.

39. The method of claim 36 wherein said substrate is a wafer and said support structure is a glass ring.

40. A method for manufacturing a mask comprising the steps of:
coating a wafer of a first material with a layer of a second material, said second material being x-ray transparent;
coating at least one side of said wafer with a layer of conductive material, said conductive material being x-ray transparent;
field assisted thermal bonding said layer of conductive material to a support structure; and
removing a portion of said first material within said wafer.

41. The method of claim 40 wherein said support structure is a glass ring.

42. The method of claim 40 wherein said conductive material comprises indium tin oxide.

43. A method for manufacturing a mask comprising the steps of:
coating a substrate with a layer of x-ray transparent conductive material;
forming a field assisted thermal bond between said x-ray transparent conductive material and a support structure; and removing at least a portion of said substrate.

44. The method of claim 43 wherein said x-ray transparent conductive material is doped boron nitride.

45. The method of claim 44 wherein said boron nitride is doped with titanium.

46. A mask comprising:
an x-ray transparent membrane;
a support structure bonded to said membrane with a field assisted thermal bond.

47. The mask of claim 46 wherein said membrane comprises indium tin oxide.

48. The mask of claim 47 wherein said layer of indium tin oxide is affixed to a boron nitride layer.

49. The mask of claim 46 wherein said membrane comprises doped boron nitride.

50. A method of making a mask comprising the steps of:
forming an x-ray transparent layer on a substrate;
etching away said substrate, thereby leaving an x-ray transparent membrane; and
forming an x-ray opaque patterned layer on the surface of said membrane previously in contact with said substrate.

51. The method of claim 50 wherein prior to removal of said substrate, said x-ray transparent layer is affixed to a support structure.

52. The method of claim 50 further comprising the step of forming at least one intermediate layer between said x-ray opaque patterned layer and said membrane, said intermediate layer facilitating adhesion of said x-ray opaque layer to said membrane.

53. The method of claim 50 further comprising the step of forming at least one intermediate layer between said x-ray opaque patterned layer and said membrane, said intermediate layer providing mechanical strength to said membrane.

54. A method for forming a mask comprising the steps of:
forming an x-ray transparent layer on both sides of a substrate;
etching a portion of said x-ray transparent layer on one side of said substrate with a bead blast etch process, thereby exposing a portion of said substrate; and
removing said exposed portion of said substrate.

55. The method of claim 54 further comprising the step of bonding said substrate to a support structure.

56. The method of claim 54 wherein sodium bicarbonate beads are used to etch said x-ray transparent layer.

57. The method of claim 54 wherein said x-ray transparent layer comprises boron nitride.

58. The method of claim 6 wherein said solid layer of material comprises polyethylene.

59. A mask comprising:
an x-ray transparent membrane;
intermediate material affixed to said membrane; and
a support structure bonded to said intermediate material with a field assisted thermal bond.

60. A method for manufacturing a mask for use in a photolithographic process comprising the steps of:
providing a substrate having a first side coated with a layer of x-ray transparent material, said substrate having a second side;
coating a portion of the said second side of said substrate with a metal layer, said metal layer having an opening through which a portion of said substrate is exposed; and
etching said exposed portion of said substrate, said metal layer acting as a mask during said step of etching said exposed portion, said metal being capable of resisting an alkali metal hydroxide etching solution.

61. The method of claim 60 wherein said step of etching is accomplished by applying a KOH solution to said substrate, said KOH solution etching said substrate.

* * * * *